United States Patent
Kim et al.

(10) Patent No.: US 7,433,252 B2
(45) Date of Patent: Oct. 7, 2008

(54) SEMICONDUCTOR MEMORY DEVICE CAPABLE OF STORING DATA OF VARIOUS PATTERNS AND METHOD OF ELECTRICALLY TESTING THE SEMICONDUCTOR MEMORY DEVICE

(75) Inventors: Gyu-Yeol Kim, Gyeonggi-do (KR); Sang-Man Byun, Gyeonggi-do (KR); Yong-Gyu Chu, Seoul (KR); Seok-Ho Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 132 days.

(21) Appl. No.: 11/267,203

(22) Filed: Nov. 4, 2005

(65) Prior Publication Data
US 2006/0098506 A1 May 11, 2006

(30) Foreign Application Priority Data
Nov. 11, 2004 (KR) .................. 10-2004-0091883

(51) Int. Cl.
*G11C 29/00* (2006.01)
(52) U.S. Cl. .................. 365/201; 714/718; 714/719; 714/720
(58) Field of Classification Search .................. 365/201, 365/189.17, 189.16; 324/754; 714/720, 714/718, 719
See application file for complete search history.

(56) References Cited

U.S. PATENT DOCUMENTS

| 6,323,664 | B1 * | 11/2001 | Kim et al. | 324/754 |
| 6,636,998 | B1 * | 10/2003 | Lee et al. | 714/735 |
| 7,120,066 | B2 * | 10/2006 | Xi | 365/189.02 |
| 2005/0108607 | A1 * | 5/2005 | Chae et al. | 714/738 |

FOREIGN PATENT DOCUMENTS

| JP | 2001-135786 | 5/2001 |
| JP | 2002-056696 | 2/2002 |
| KR | 2001-10733 | 2/2001 |
| KR | 2001-27864 | 4/2001 |

OTHER PUBLICATIONS

English language abstract of Korean Publication No. 2001-10733.
English language abstract of Korean Publication No. 2001-27864.
English language abstract of Japanese Publication No. 2001-135786.
English language abstract of Japanese Publication No. 2002-056696.

* cited by examiner

*Primary Examiner*—J. H. Hur
*Assistant Examiner*—Douglas King
(74) *Attorney, Agent, or Firm*—Marger Johnson & McCollom, P.C.

(57) ABSTRACT

A semiconductor memory device to which information of different data bits can be written, and a method of electrically testing the semiconductor memory device are provided. In a mode for testing a memory cell array of the semiconductor memory device, the semiconductor memory comprises a control signal generation pad capable of writing non-identical data to data input/output pads of each group when data is written to the memory cell array.

12 Claims, 5 Drawing Sheets

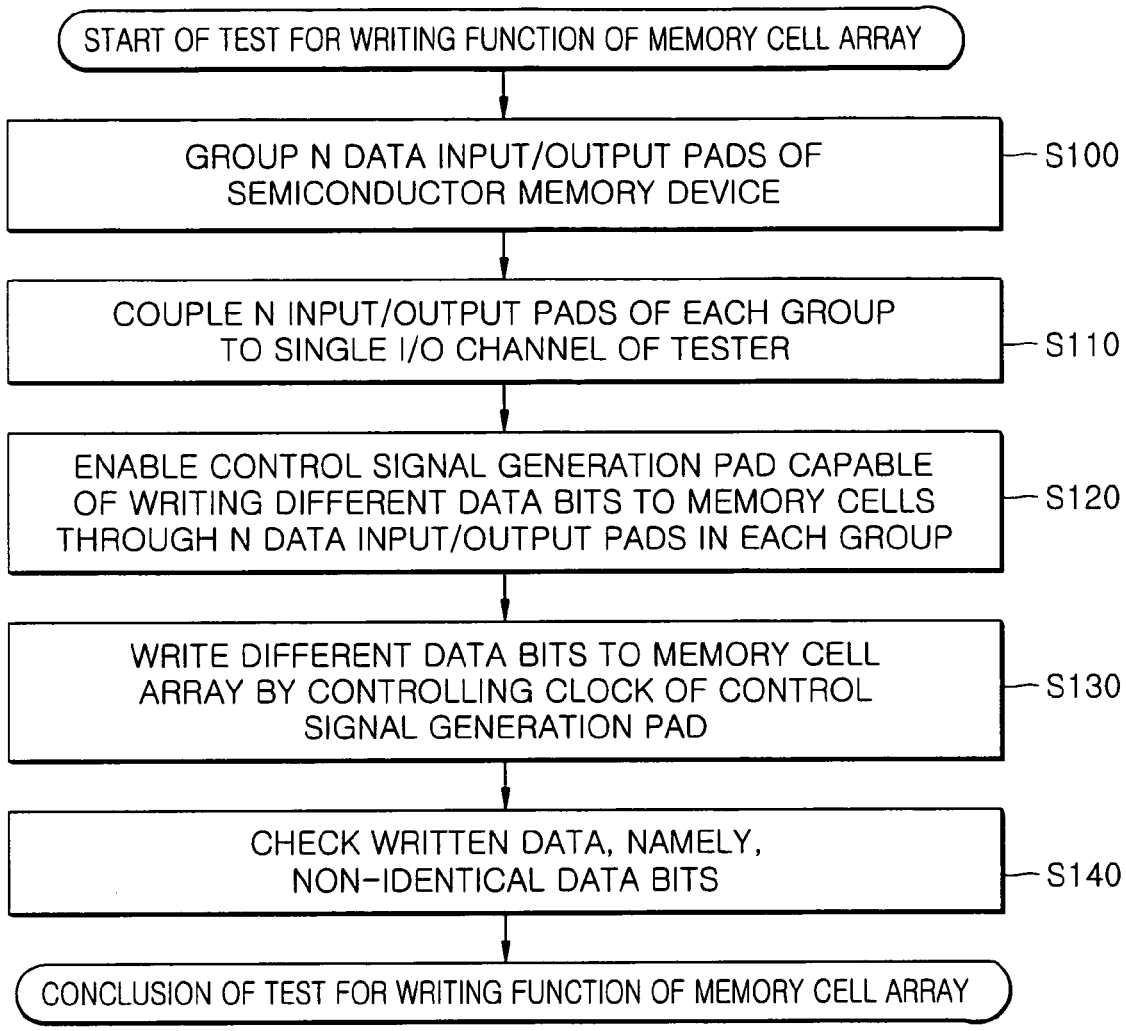

SEMICONDUCTOR MEMORY DEVICE CAPABLE OF STORING DATA OF VARIOUS PATTERNS AND METHOD OF ELECTRICALLY TESTING THE SEMICONDUCTOR MEMORY DEVICE

BACKGROUND OF THE INVENTION

This application claims priority and benefit of Korean Patent Application No. 10-2004-0091883, filed on Nov. 11, 2004, the disclosure of which is herein incorporated by reference in its entirety.

1. Field of the Invention

The invention relates to semiconductor memory devices, and more particularly, to a semiconductor device capable of storing data of various patterns and a method of electrically testing the same.

2. Description of the Related Art

Functions of semiconductor memory devices are electrically tested using address pins, data pins, and control pins included in the semiconductor memory devices. Testing the semiconductor memory devices simultaneously provides an efficient means of performing the electrical test and, thus, minimizes costs. However, since a tester has a limited number of channels, the number of semiconductor memory devices capable of being simultaneously tested, that is, being subject to a parallel test, is limited.

A means of increasing the number of semiconductor memory devices that can be simultaneously tested is by reducing the number of I/O channels of a tester allotted to data pins of semiconductor memory devices. A related technique was disclosed by Samsung Electronics Ltd in U.S. Pat. No. 6,323,664, issued to Kim, et al. on Nov. 27, 2001, entitled "Semiconductor Memory Device Capable of Accurately Testing for Defective Memory Cells at a Wafer Level."

FIG. 1 is a block diagram of a memory cell array in a conventional test mode of a semiconductor memory device. FIG. 2 is a flowchart illustrating a method of electrically testing the semiconductor memory device of FIG. 1.

Referring to FIGS. 1 and 2, the semiconductor memory device includes data input/output pads PAD0 through PAD31 and a memory cell array 18, to and from which data can be written and read.

To undergo an electrical function test, the semiconductor memory device is connected to a tester 16 via a probe card/device under test (DUT) board 14. To reduce the number of I/O channels 10 of the tester 16 used to test the semiconductor memory device, the data input/output pads PAD0 through PAD31 are divided into groups MDQ0 through MDQ7, each of which include four data input/output pads. One representative data input/output pad from each group is the coupled to one I/O channel 10 of the tester 16 via an assigned probe needle 12 of the probe card/DUT board 14. For example, PAD0 is selected as the representative data input/output pad of the group MDQ0 and PAD4 is selected as the representative data input/output pad of the group MDQ1. Thus, eight representative data input/output pads PAD0, PAD4, . . . , PAD28 are coupled to the tester 16 via probe needles 12 of the probe card/DUT board 14.

In an electrical test of a semiconductor memory device based on the design scheme shown in FIG. 1, a general direct current (DC) test and a function test for memory devices are performed first. As shown in FIG. 2, to test a writing function of the memory cell array 18, the I/O channels 10 of the tester 16 via the probe card/DUT board 14 send to-be-written data to memory cells through the representative pads PAD0, PAD4, . . . , PAD28. The data is transferred not only to data input buffers DIN_BUF0, DIN_BUF4, . . . , DIN_BUF28 corresponding to the representative pads PAD0, PAD4, . . . , PAD28, but also to the remaining data input buffers via a data transfer path for a test mode illustrated by a dotted line in FIG. 1, and written to the memory cell array 18, in operation S10. Then, the written data is read out from the memory cell array 18 to check if the memory cell array 18 is normal or defective, in operation S20.

In the conventional art as shown in FIG. 1, when data is written to the memory cell array 18 via representative pads PAD0, PAD4, . . . , and PAD28 of groups MDQ0 through MDQ7, identical data bits are transmitted to the four input/output pads in each group. For example, a data bit of 0 or 1 is transferred to all of the four input/output pads PAD0, PAD1, PAD2, and PAD3 in group MDQ0. Thus, when different data bits are written through neighboring input/output pads, it is impossible to determine defective memory cells. For example, when data of 1111 is written to neighboring memory cells of the memory cell array 18 through input/output pads in a group, for example, PAD0 through PAD3 of group MDQ0, the writing test is properly performed. However, when data of 1010 is written to neighboring memory cells of the memory cell array 18, defective cells cannot be checked.

As described above, in the conventional art, semiconductor devices can be effectively parallel tested by reducing the number of I/O channels of a tester that are assigned to data pins of the semiconductor devices. However, in the conventional art, accurately testing the memory cell array 18 through writing of data of various bit patterns is limited.

SUMMARY OF THE INVENTION

The invention provides a semiconductor memory device including a control signal generation pad capable of writing different data to data input/output pads of each group during a test mode.

The invention also provides a method of electrically testing a semiconductor memory device using a control signal generation pad capable of writing different data to data input/output pads of each group during a test mode.

According to an aspect of the invention, there is provided a semiconductor memory device including: a memory cell array storing data; address pads used to designate the memory cell array; data input/output pad groups via which the data is read from and written to the memory cell array, the data input/output pad groups into each of which N data input/output pads are classified in a test mode for the memory cell array; and a control signal generation pad capable of writing non-identical data to the N data input/output pads of each group when data is written to the memory cell array in the test mode for the memory cell array.

The control signal generation pad may be connected to a data input multiplexer (DINMUX) included in the semiconductor memory device. The DINMUX may control designation of data input/output pads according to the frequency of toggling of a control signal.

The control signal generation pad may be a control pin for a semiconductor memory device not used in a test mode for the memory cell array.

According to another aspect of the invention, there is provided a method of electrically testing a semiconductor memory device, including operations of: starting a test for a writing function of a memory cell array of the semiconductor memory device; grouping N data input/output pads of the semiconductor memory device; enabling a control signal generation pad capable of writing non-identical data to the N data input/output pads of each group when data is written through the N data input/output pads; writing different data bits to neighboring memory cells of the memory cell array of the semiconductor memory device using the control signal generation pad; reading out the written data from the memory cell array of the semiconductor memory device; and concluding the test for the writing function of the memory cell array of the semiconductor memory device.

The test for the writing function of the memory cell array may be included in an electrical die sort (EDS) test or a final test.

BRIEF DESCRIPTION OF THE DRAWINGS

The above and other features and advantages of the invention will become more apparent by describing in detail exemplary embodiments thereof with reference to the attached drawings in which:

FIG. 5 is a flowchart illustrating a method of electrically testing the semiconductor memory device according to the invention.

DETAILED DESCRIPTION OF THE EMBODIMENTS

The invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
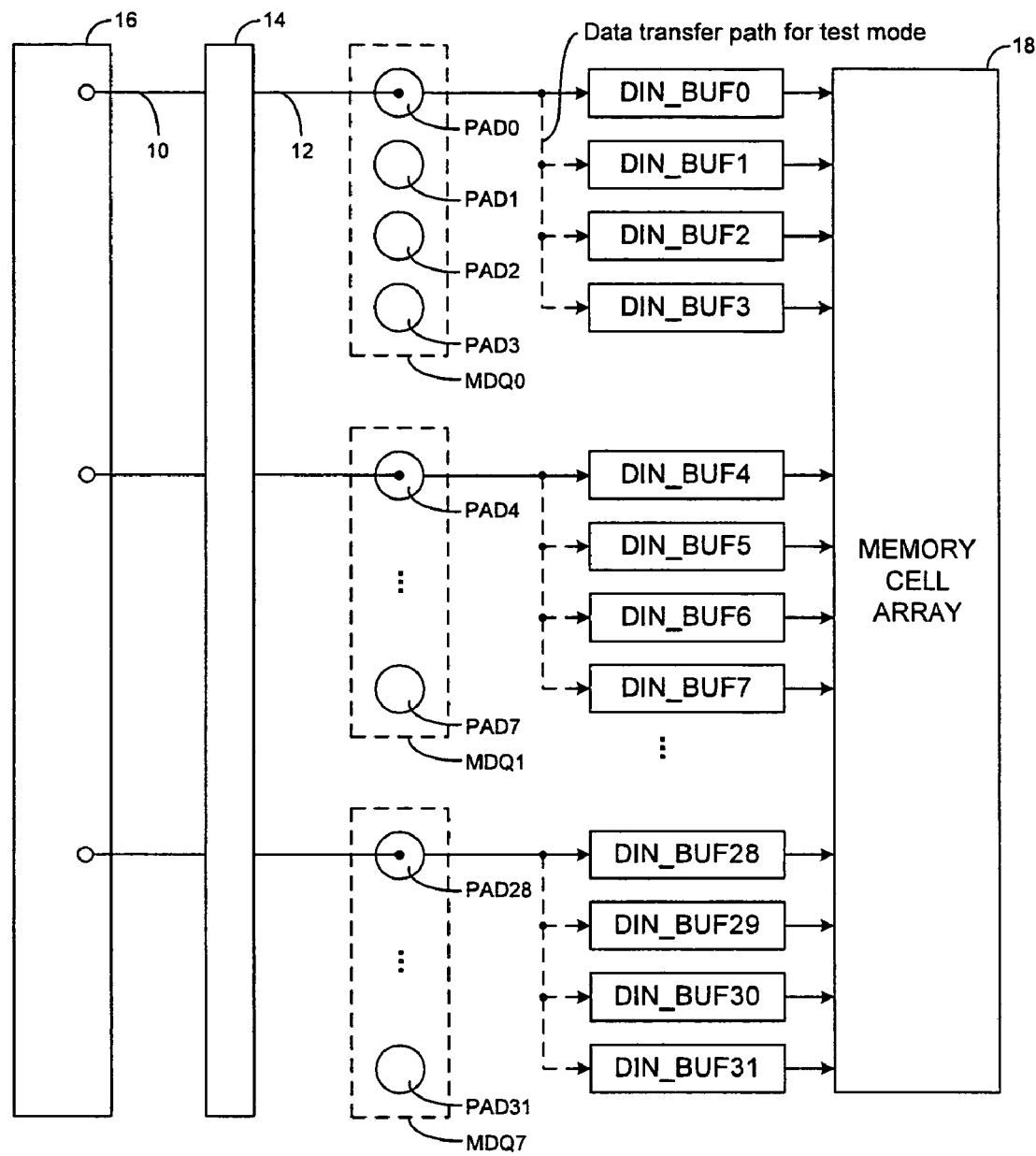
FIG. 1 is a block diagram for explaining an operation of writing data to a memory cell array in a test mode of a conventional semiconductor memory device.
Figure 2:
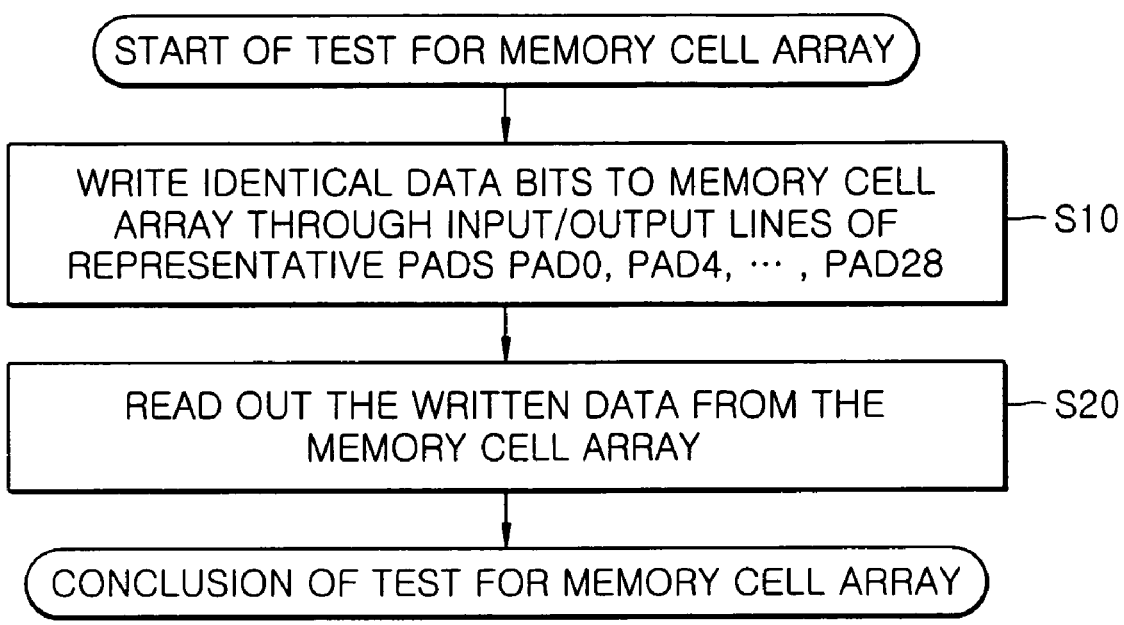
FIG. 2 is a flowchart illustrating a method of electrically testing the semiconductor memory device of FIG. 1.
Figure 3:
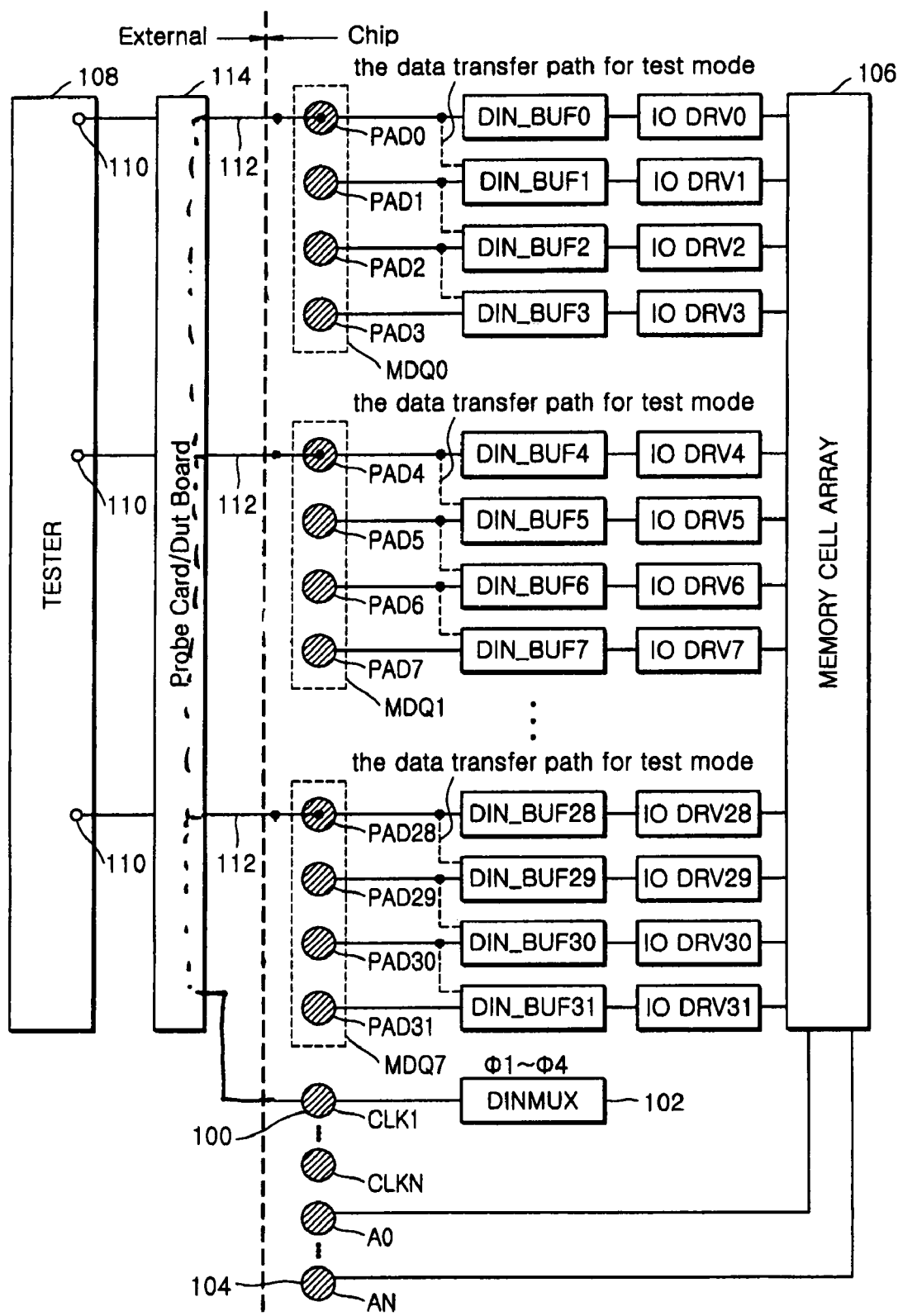
FIG. 3 is a block diagram for explaining an operation of writing data to a memory cell array in a test mode of a semiconductor memory device according to the invention.

FIG. 3 is a block diagram for explaining an operation of writing data to a memory cell array in a test mode of a semiconductor memory device according to the invention. The semiconductor memory device according to the invention, to which data of various bit patterns can be written, includes a memory cell array 106, address pads A0-AN 104, data input/output pads PAD0 through PAD31, and control signal generation pads CLK1 through CLKN 100. The memory cell array 106 stores data. The address pads A0-AN 104 are used to designate the memory cell array 106. In a mode for testing the memory cell array 106, the data input/output pads PAD0 through PAD31 are grouped into MDQ0 through MDQ7, each group comprising four data input/output pads. The data input/output pad groups MDQ0 through MDQ7 can read information of data bits from and write information of data bits to the memory cell array 106. The control signal generation pads CLK1-CLKN 100 enable non-identical data to be written to the data input/output pads PAD0 through PAD31 when data is written to the memory cell array 106 in the test mode for the memory cell array 106.

The semiconductor device further includes a data input multiplexer (DINMUX) 102, which is connected to the control signal generation pad 100, to write non-identical data to the data input/output pads PAD0 through PAD31 in write and read test modes. The control signal generation pad 100 may be a control pin not used in the write and read test modes for the memory cell array 106.

The control signal generation pad 100 is coupled to representative pads PAD0, PAD4, . . . , and PAD28 of the data input/output pads PAD0 through PAD31 via probe needles 112 to which input/output (I/O) channels 110 of a tester 108 are connected. Thereafter, four data input/output pads in each group, for example, PAD0, PAD1, PAD2, and PAD3 in group MDQ0, are designated to be connected to an I/O channel 110 of the tester 108 one by one according to the frequency of toggling of a clock generated by the DINMUX 102. Similarly, the remaining data input/output pads PAD4 through PAD31 in groups MDQ1 through MDQ7 are designated separately.

When the data input/output pads PAD0 through PAD31 are designated by the control signal generation pad 100, different data are provided to the data input/output pads PAD0 through PAD31 of the groups MDQ0 through MDQ7 from the I/O channels 110 of the tester 108 via a probe card/DUT board 114, transferred to data input buffers DIN_BUF0 through DIN_BUF31 and input/output drivers 10 DRV0 through IO DRV31 along a data transfer path for a test mode, and written to the memory cell array 106.

Although the number of data input/output pads included in each of the groups MDQ0 through MDQ7 is 4 in the present embodiment, the number may be changed to a multiple of 2, for example, 2 or 8. Also, although a control pin not used in the mode for testing the memory cell array 106 is used as the control signal generation pad 100 in the present embodiment, a Not Connection (NC) pin not used in a semiconductor memory device may be used as the control signal generation pad 100. The control signal generation pad 100 may be produced in various forms by a circuit designer of a semiconductor memory device.

Figure 4:
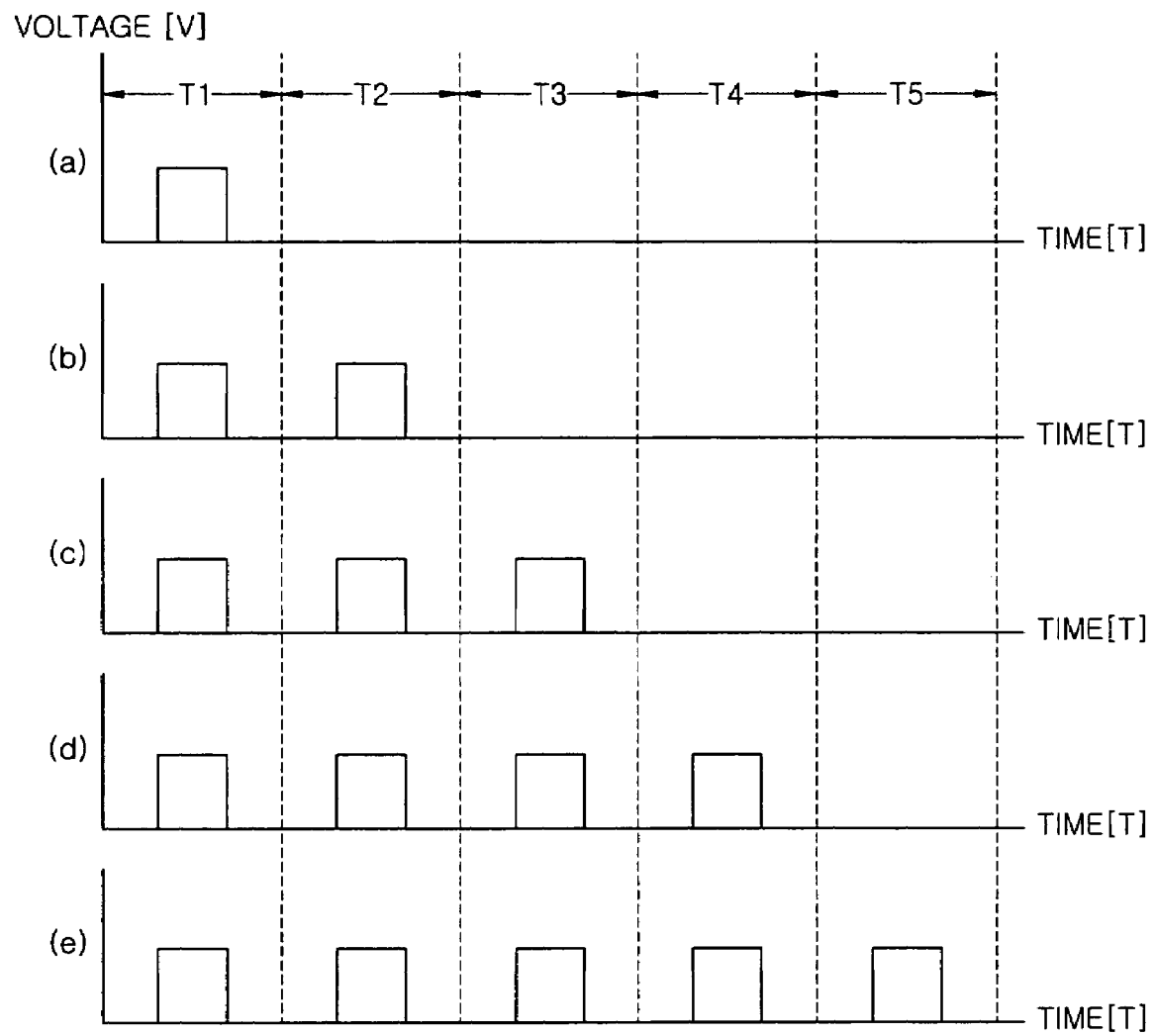
FIG. 4 is a timing chart for explaining an example where a data input/output multiplexer (DINMUX) of FIG. 3 applies a clock to select input/output pads PAD0 through PAD3.

FIG. 4 is a timing chart for explaining an example where the DINMUX 102 applies a clock to select the data input/output pads PAD0 through PAD3. Referring to FIG. 4, a control signal which is sent to the data input/output pad groups MDQ0 through MDQ7 via the control signal generation pad 100 is illustrated. In case (a) where toggling occurs only in interval T1, a first input/output pad, for example, PAD0, is enabled. In case (b) where toggling occurs in intervals T1 and T2, a second input/output pad, for example, PAD1, is enabled. In case (c) where toggling occurs in intervals T1, T2, and T3, a third input/output pad, for example, PAD2, is enabled. In case (d) where toggling occurs in intervals TI through T4, a fourth input/output pad, for example, PAD3, is enabled.

In case (e) where toggling occurs in intervals T1 through T5, a pair of input/output pads may be enabled. For example, in case (e), input/output pads PAD0 and PAD1 may be selected, or input/output pad PAD2 and PAD3 may be selected. However, the selection of the input/output pads PAD0 through PAD31 according to the control signal clocks (a) through (e) may be achieved by other methods by a circuit designer of a semiconductor memory device. The present embodiment introduces only an example.

FIG. 5 is a flowchart illustrating a method of electrically testing a semiconductor memory device according to the invention. Referring to FIG. 5, an electrical test for a semiconductor memory device starts. At this time, typically conducted DC characteristic test and other function tests are executed. Thereafter, a test for a writing function of a memory cell array starts. In operation S100, N data input/output pads of the semiconductor memory device are grouped in the test for the writing function of the memory cell array. N is a multiple of 2, so it may be, for example, 2, 4, or 8. Then, N input/output pads of each group are coupled to a single I/O channel of a tester, in operation S110.

In operation S120, a control signal generation pad capable of writing different data to memory cells through N data input/output pads in each group is enabled as illustrated in FIG. 4. Thereafter, non-identical data, for example, data bits of 1, 0, 1, and 0, are written to the memory cell array through neighboring data input/output pads using the control signal generation pad, in operation S130. Then, the written data, namely, non-identical data, are checked in operation S140, thereby testing a function of the memory cell array of the semiconductor memory device. The test is concluded.

According to the invention as described above, the number of I/O channels of a tester that are used when electrically testing a semiconductor memory device can be effectively reduced, and data of various bit patterns can be written to a cell array of the semiconductor memory device through a reduced number of I/O channels of the tester. Thus, the accuracy of an electrical test for semiconductor memory devices is increased.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A method of electrically testing a semiconductor memory device, comprising:
   dividing a plurality of data input/output pads into a plurality of data input/output groups;
   coupling a control signal generation pad to the data input/output pads;
   outputting a control signal through the control signal generation pad;
   enabling at least one data input/output pad of each data input/output group in response to the control signal;
   writing non-identical data bits to neighboring memory cells of a memory cell array through the enabled data input/output pads; and
   reading out the written data from the memory cell array.

2. The method of claim 1, further comprising connecting the plurality of data input/output pads of each group to one input/output (I/O) channel of a tester.

3. The method of claim 1, wherein the semiconductor memory device comprises 2N (N is a natural number) data input/output pads.

4. The method of claim 1, wherein outputting the control signal through the control signal generation pad comprises outputting the control signal from a data input multiplexer (DINMUX) included in the semiconductor memory device that is coupled to the control signal generation pad.

5. The method of claim 1, wherein writing the data bits to the memory cells of the memory cell array through the enabled data input/output pads comprises separately enabling each data input/output pad of one of the data input/output groups according to a frequency of toggling of the control signal.

6. The method of claim 1, wherein in the test for the writing function of the memory cell array, writing of data to 2m (m is a natural number) memory cells is tested.

7. The method of claim 6, wherein the control signal generation pad is a control pin for the semiconductor memory device not used in the writing of data to the 2m memory cells outside of the test for the writing function of the memory cell array.

8. The method of claim 1, wherein the test for the writing function of the memory cell array is included in an electrical die sort (EDS) test.

9. The method of claim 1, wherein the test mode for the writing function of the memory cell array is included in a final test.

10. The method of claim 1, wherein the control signal generation pad is a no-connect (NC) pad.

11. The method of claim 1, wherein outputting the control signal comprises:
    generating at least one pulse over a plurality of time intervals as the control signal;
    wherein for each data input/output group, each of the data input/output pads of the group are enabled in response to a different sequence of the least one pulse over the time intervals.

12. The method of claim 1, wherein coupling the control signal generation pad to the data input/output pads comprises coupling the control signal generation pad to the data input/output pads through probe needles of a tester used in the testing of the semiconductor memory device.

* * * * *